US012689226B2

(12) United States Patent
Jin

(10) Patent No.: US 12,689,226 B2
(45) Date of Patent: Jul. 21, 2026

(54) BATTERY PROTECTIVE CIRCUIT FOR SHORT CIRCUIT DETECTION AND BATTERY PACK COMPRISING SAME

(71) Applicant: Samsung SDI Co., Ltd., Yongin-si (KR)

(72) Inventor: Kyongpil Jin, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 893 days.

(21) Appl. No.: 16/960,498

(22) PCT Filed: Nov. 30, 2018

(86) PCT No.: PCT/KR2018/015057
§ 371 (c)(1),
(2) Date: Jul. 7, 2020

(87) PCT Pub. No.: WO2019/151631
PCT Pub. Date: Aug. 8, 2019

(65) Prior Publication Data
US 2020/0381929 A1 Dec. 3, 2020

(30) Foreign Application Priority Data

Feb. 5, 2018 (KR) ......................... 10-2018-0014183

(51) Int. Cl.
*H02J 7/60* (2026.01)
*G01R 31/52* (2020.01)
(Continued)

(52) U.S. Cl.
CPC ................ *H02J 7/60* (2026.01); *G01R 31/52* (2020.01); *H01M 10/425* (2013.01);
(Continued)

(58) Field of Classification Search
CPC ........ G01R 31/52; G01R 31/36; G01R 31/50; H01M 10/425; H01M 10/48;
(Continued)

(56) References Cited

U.S. PATENT DOCUMENTS 3,810,448 A * 5/1974 Ford ....................... F02D 41/20
123/477
2004/0109274 A1 6/2004 Sato
(Continued)

FOREIGN PATENT DOCUMENTS

CN 1507089 A 6/2004
CN 101752844 A 6/2010
(Continued)

OTHER PUBLICATIONS

EPO Extended European Search Report dated Oct. 5, 2021, issued in corresponding European Patent Application No. 18903807.8 (9 pages).
(Continued)

*Primary Examiner* — Drew A Dunn
*Assistant Examiner* — Manuel Hernandez
(74) *Attorney, Agent, or Firm* — Womble Bond Dickinson (US) LLP

(57) ABSTRACT

A battery protective circuit may include: a first switch connected between a negative pack terminal of a battery pack and an output node to control an electrical connection between the negative pack terminal and the output node; a first resistor connected between the output node and a ground; and a controller configured to control on or off of the first switch and to determine a short circuit state between pack terminals of the battery pack based on an output voltage of the output node.

10 Claims, 3 Drawing Sheets

(51) Int. Cl.

| | |
|---|---|
| *H01M 10/42* | (2006.01) |
| *H01M 10/48* | (2006.01) |
| *H01M 50/574* | (2021.01) |
| *G01R 31/36* | (2020.01) |
| *G01R 31/50* | (2020.01) |
| *H01M 50/569* | (2021.01) |
| *H02H 7/18* | (2006.01) |

(52) U.S. Cl.
CPC ......... *H01M 10/48* (2013.01); *H01M 50/574* (2021.01); *H02J 7/663* (2026.01); *G01R 31/36* (2013.01); *G01R 31/50* (2020.01); *H01M 50/569* (2021.01); *H02H 7/18* (2013.01)

(58) Field of Classification Search
CPC .. H01M 50/574; H01M 50/569; H02J 7/0029; H02J 7/0031; H02J 7/60; H02J 7/663; H03K 17/08104; H03K 17/6871; H02H 7/18
USPC ......................................................... 320/134
See application file for complete search history.

(56) References Cited

U.S. PATENT DOCUMENTS

| | | | |
|---|---|---|---|
| 2007/0210804 A1* | 9/2007 | Endoh ...................... | G01R 31/52 324/522 |
| 2009/0155674 A1 | 6/2009 | Ikeuchi et al. | |
| 2010/0157495 A1 | 6/2010 | Densham | |
| 2010/0188050 A1 | 7/2010 | Asakura et al. | |
| 2010/0188054 A1* | 7/2010 | Asakura ............... | H01M 4/5825 320/161 |
| 2010/0259856 A1* | 10/2010 | Senriuchi ............... | H02H 3/066 361/49 |
| 2011/0095765 A1 | 4/2011 | Tae et al. | |
| 2011/0304302 A1 | 12/2011 | Kim | |
| 2012/0139494 A1 | 6/2012 | Kim | |
| 2014/0327450 A1* | 11/2014 | Schmauss .............. | G01R 31/67 324/538 |
| 2015/0130471 A1* | 5/2015 | Bolduc .............. | G01R 31/3835 324/427 |
| 2015/0316619 A1* | 11/2015 | Jeon ................... | G01R 31/3835 307/130 |
| 2018/0323624 A1* | 11/2018 | Chang ...................... | H02J 7/06 |
| 2018/0331093 A1 | 11/2018 | Takahashi et al. | |

FOREIGN PATENT DOCUMENTS

| | | | |
|---|---|---|---|
| CN | 106026036 A | | 10/2016 |
| CN | 217739421 U | * | 11/2022 |
| EP | 2073031 A2 | | 6/2009 |
| EP | 2159868 A1 | | 3/2010 |
| JP | 2002-67792 A | | 3/2002 |
| JP | 2004-227780 A | | 8/2004 |
| KR | 1993-0000724 B1 | | 1/1993 |
| KR | 10-1047651 B1 | | 7/2011 |
| KR | 10-2011-0135289 A | | 12/2011 |
| KR | 10-2012-0059852 A | | 6/2012 |
| KR | 10-1312124 B1 | | 9/2013 |
| KR | 10-2015-0141824 A | | 12/2015 |
| KR | 10-2017-0006765 A | | 1/2017 |
| WO | 2016/041601 A1 | | 3/2016 |
| WO | WO 2017/141811 A1 | | 8/2017 |

OTHER PUBLICATIONS

Chinese Office Action, with English translation, dated Jan. 13, 2023, issued in corresponding Chinese Patent Application No. 201880088653.6 (14 pages).

Korean Office Action, with English translation, dated Feb. 9, 2023, issued in corresponding Korean Patent Application No. 10-2018-0014183 (9 pages).

\* cited by examiner

FIG. 1

BATTERY PROTECTIVE CIRCUIT FOR SHORT CIRCUIT DETECTION AND BATTERY PACK COMPRISING SAME

CROSS-REFERENCE TO RELATED APPLICATION(S)

This application is a National Phase Patent Application of International Patent Application Number PCT/KR2018/015057, filed on Nov. 30, 2018, which claims priority of Korean Patent Application No. 10-2018-0014183, filed Feb. 5, 2018. The entire contents of both of which are incorporated herein by reference.

TECHNICAL FIELD

An exemplary embodiment relates to a battery protective circuit and a battery pack including the same.

BACKGROUND ART

A rechargeable battery may be charged and discharged, and is applied to various portable electronic devices. The rechargeable battery is formed to include a battery pack in combination with a charge and discharge circuit, and is charged by an external power source and discharged to an external load through a pack terminal provided in the battery pack.

On the other hand, when a battery pack is used to drive a motor, a phenomenon in which output terminals of the battery pack are short-circuited due to an abnormality of the motor often occurs. A main cause of this phenomenon is an internal short circuit of the motor, and the internal short circuit phenomenon of the motor may occur intermittently or in some cases continuously.

DISCLOSURE

Technical Problem

An exemplary embodiment has been made in an effort to provide a battery protective circuit for protecting a battery pack from an internal short circuit of a load and a battery pack including the same

Technical Solution

An exemplary embodiment of the present invention provides a battery protective circuit including: a first switch connected between a negative pack terminal of a battery pack and an output node to control an electrical connection between the negative pack terminal and the output node; a first resistor connected between the output node and a ground; and a controller configured to control on or off of the first switch and to determine a short circuit state between pack terminals of the battery pack based on an output voltage of the output node.

The battery protective circuit may further include a diode connected between the negative pack terminal and a first terminal of the first switch.

The battery protective circuit may further include a second resistor connected between the first switch and the output node.

The battery protective circuit may further include a second switch connected between a control terminal of the first switch and the ground to control a voltage applied to a control terminal of the first switch depending on a control signal applied from the controller.

The battery protective circuit may further include a third resistor connected between control terminals of the second switch and the first switch, and a fourth resistor connected between the negative pack terminal and a control terminal of the first switch.

In the battery protective circuit, the first switch and the second switch may be a P-channel transistor and an N-channel transistor, respectively, and on or off of the P-channel transistor may be controlled depending on a voltage applied to the control terminal of the P-channel transistor through the N-channel transistor.

In the battery protective circuit, the controller may turn on the first switch in a state where a discharge control switch of the battery pack is turned off.

An exemplary embodiment of the present invention provides a battery pack including: a plurality of pack terminals; a battery module configured to include one or more cells; a discharge control switch connected between one of the pack terminals and the battery module to connect or cut off a discharge path of the battery module; a first switch connected between an output node and a negative pack terminal among the pack terminals to control electrical connection between the negative pack terminal and the output node; a first resistor connected between the output node and a ground; and a controller configured to control on or off of the first switch and to determine a short circuit state between the pack terminals based on an output voltage of the output node.

The battery pack may further include a second switch connected between a control terminal of the first switch and the ground to control a voltage applied to a control terminal of the first switch depending on a control signal applied from the controller.

In the battery pack, the first switch and the second switch may be a P-channel transistor and an N-channel transistor, respectively, and on or off of the P-channel transistor may be controlled depending on a voltage applied to the control terminal of the P-channel transistor through the N-channel transistor.

In the battery pack, the controller may turn on the second switch in a state where the discharge control switch is turned off to monitor a short circuit between the pack terminals.

In the battery pack, the controller may monitor a short circuit between the pack terminals by turning on the second switch for a predetermined time before the discharge control switch is switched to an on state by starting an operation of a load connected through the pack terminals.

In the battery pack, when the discharge control switch is turned off due to a short circuit during operation of a load connected through the pack terminals, the controller may periodically monitor the short circuit between the pack terminals by periodically turning on the second switch until the short circuit is released.

Advantageous Effects

The battery protection circuit according to the exemplary embodiments may protect the battery pack from an internal short circuit of the load.

DESCRIPTION OF THE DRAWINGS

FIG. 1 schematically illustrates a battery pack according to an exemplary embodiment.

MODE FOR INVENTION

Figure 2:
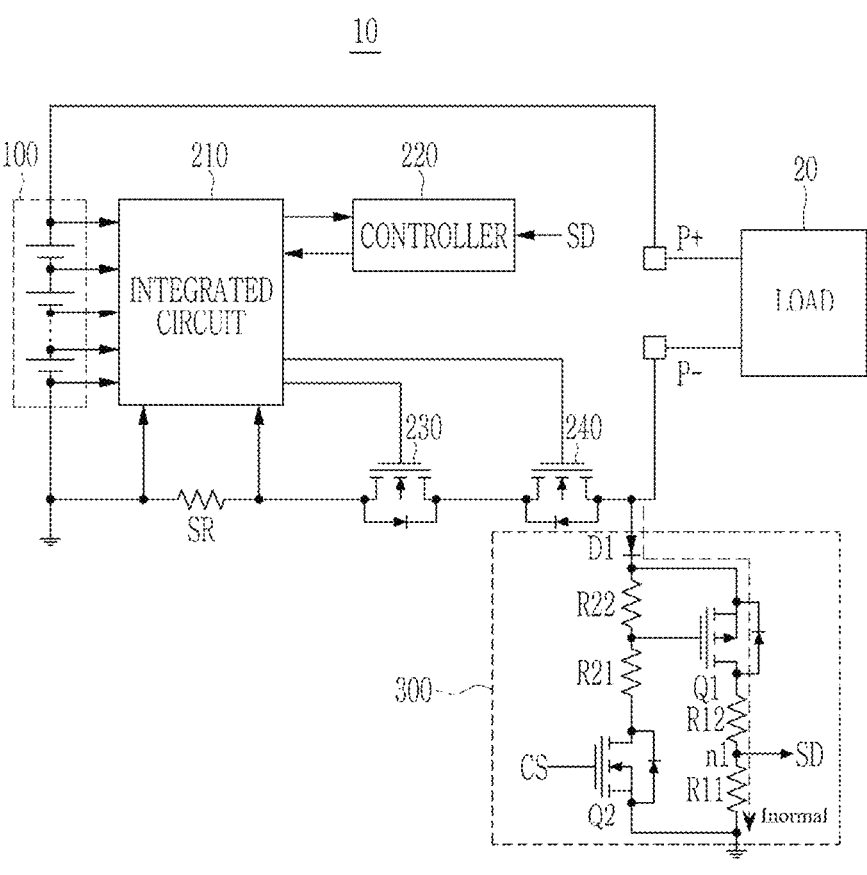
FIG. 2 and FIG. 3 illustrate views for describing an operation of a short circuit detection circuit according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

To clearly describe the exemplary embodiments, parts that are irrelevant to the description are omitted, and like numerals refer to like or similar constituent elements throughout the specification. Therefore, the reference numbers of the constituent elements used in a previous drawing may be used in a next drawing.

Further, since sizes and thicknesses of constituent members shown in the accompanying drawings are arbitrarily given for better understanding and ease of description, the exemplary embodiments are not limited to the illustrated sizes and thicknesses. In the drawings, the thickness of layers, films, panels, regions, etc., are exaggerated for clarity.

A case of electrically connecting two constituent elements includes not only a case of directly connecting the constituent elements but also a case of connecting the constituent elements via another constituent element therebetween. The constituent element therebetween may include a switch, a resistor, a capacitor, and the like. In describing exemplary embodiments, an expression of connection indicates electrical connection unless explicitly described to be direct connection.

Hereinafter, a battery protective circuit and a battery pack including the same according to an exemplary embodiment will be described with reference to necessary drawings.

Figure 1:
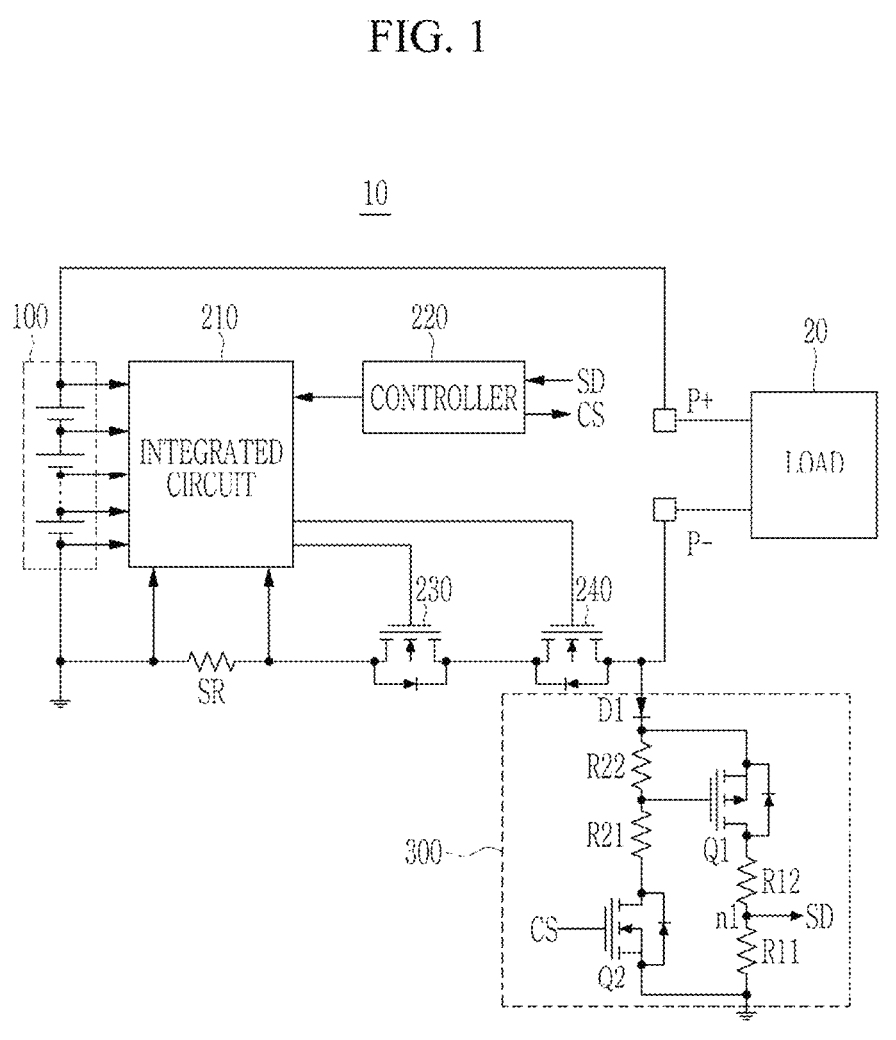
Figure 3:
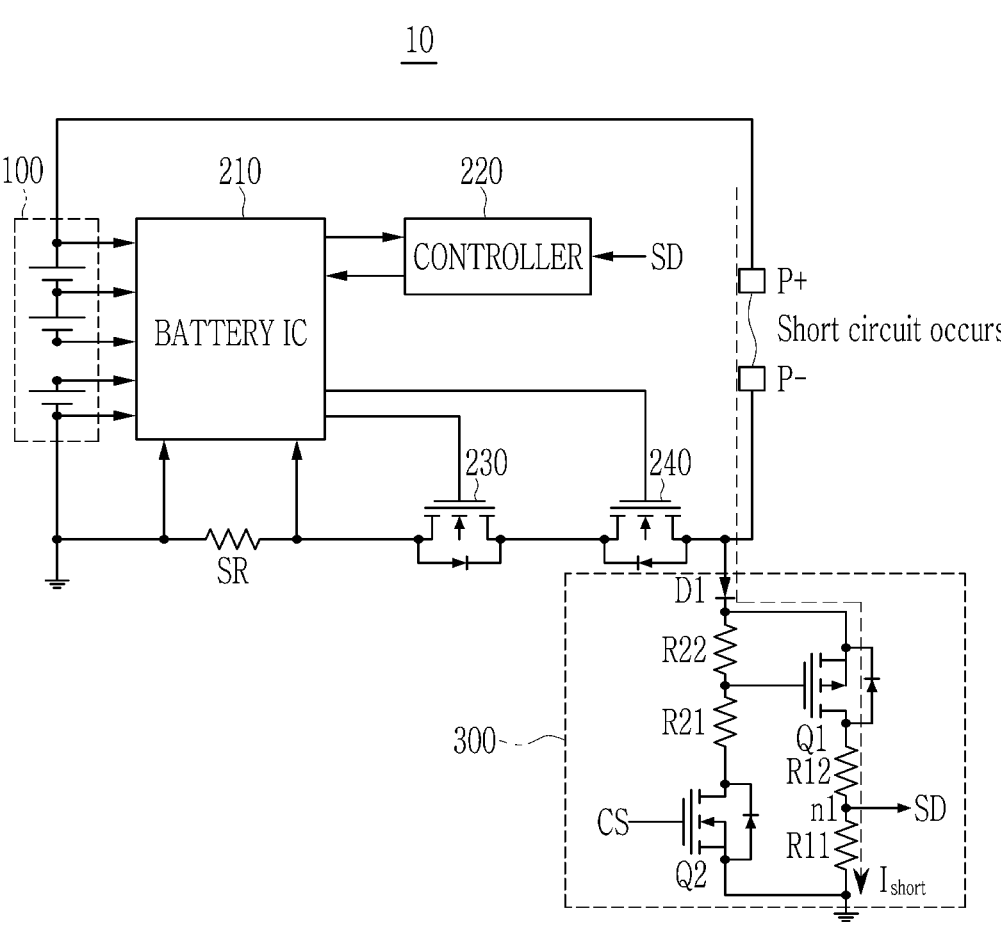

FIG. 1 schematically illustrates a battery pack according to an exemplary embodiment. In addition, FIG. 2 and FIG. 3 illustrate views for describing an operation of a short circuit detection circuit according to an exemplary embodiment.

Referring to FIG. 1, the battery pack 10 according to an exemplary embodiment may include a plurality of pack terminals P+ and P−, a battery module 100, and a battery protection circuit.

The pack terminals P+ and P− are terminals for receiving charging power from a charging device (not illustrated) outside the battery pack 10 or for discharging power of the battery module 100 to a load 20 by electrically connecting the battery module 100 with the charging device or the load 20.

The battery module 100 may include one or more cells that are connected in series or in parallel with each other.

The battery protective circuit may be electrically connected between the battery module 100 and the pack terminals P+ and P−, and the battery module 100 may be protected from problems such as a short circuit, a disconnection, an overcurrent, and an overvoltage that may occur during charging and discharging of the battery module 100.

The battery protective circuit may include a shunt resistor SR, a battery integrated circuit IC 210, a controller 220, a discharge control switch 230, a charge control switch 240, and a short circuit detection circuit 300.

The discharge control switch 230 may be connected in series in a discharge path of the battery module 100 to block or connect the discharge path of the battery module 100. The discharge path is a path through which a discharge current flows between the load 20 and the battery module 100 which are connected through the pack terminals P+ and P−, and a current flowing through the path is relatively large, and thus it is also used as a large current path.

The charge control switch 240 may be connected in series in a charge path of the battery module 100 to block or connect the charge path of the battery module 100. The charge path is a path through which a charge current flows between the charging device (not illustrated) and the battery module 100 which are connected through the pack terminals P+ and P−, and a current flowing through the path is relatively large, and thus it is also used as a large current path together with the discharge path.

Referring to FIG. 1, the discharge control switch 230 and the charge control switch 240 may be N-channel field effect transistors. In this case, a first terminal, a second terminal, and a control terminal of each of the discharge control switch 230 and the charge control switch 240 may be a source terminal, a drain terminal, and a gate terminal, respectively. In addition, the drain terminals of the discharge control switch 230 and the charge control switch 240 are connected to each other, and the source terminals of the discharge control switch 230 and the charge control switch 240 are respectively connected to the battery module 100 and the pack terminal P−.

Meantime, although the case where the discharge control switch 230 and the charge control switch 240 are connected between the negative electrode of the battery module 100 and the negative electrode pack terminal P− of the battery pack 10 is illustrated in FIG. 1 as an example, the present invention is limited thereto. According to another exemplary embodiment, the discharge control switch 230 and the charge control switch 240 may be connected between the positive electrode of the battery module 100 and the positive electrode terminal P+ of the battery pack 10.

The battery IC 210 may detect a state of the battery module 100 such as a cell voltage and a charging and discharging current. For example, the battery IC 210 includes a voltage detection circuit (not illustrated), and a cell voltage of each of the cells constituting the battery module 100 may be detected by using the voltage detection circuit. In addition, for example, the battery IC 210 may include a current detection circuit (not illustrated) for detecting a current flowing through the shunt resistor SR, and a current during charging or discharging of the battery module 100 may be detected by using the current detection circuit.

The battery IC 210 may detect a short circuit, a disconnection, an overcurrent, a low voltage, an overvoltage, etc. that may occur during charging and discharging of the battery module 100 based on the state of the battery module 100, and may control the discharge control switch 230 and the charge control switch 240 depending on the detection result.

The battery IC 210 may include a cell balancing circuit (not illustrated), and may perform a cell balancing function between the cells constituting the battery module 100 by using the cell balancing circuit.

The controller 220 may operate as a battery management system (BMS) to control general operations of the battery pack 10, such as charging and discharging control and communication with an upper system (not illustrated).

The short circuit detection circuit 300 may be connected between the negative electrode pack terminal P− and a ground to detect a short circuit between the pack terminals P+ and P−. The short circuit detection circuit 300 may include a diode D1, a plurality of switches Q1 and Q2, and a plurality of resistors R11, R12, R21, and R22.

The first switch Q1 may be connected between the negative pack terminal P− and an output node n1 to control electrical connection between the negative pack terminal P− and the output node n1. That is, the first switch Q1 conducts the negative pack terminal P− and the output node n1 in an on state, and cuts off the electrical connection between the negative pack terminal P− and the output node n1 in an off state.

A first terminal and a second terminal of the first switch Q1 are electrically connected to the negative pack terminal P− and the output node n1, respectively, and a connection of the first terminal and the second terminal is switched depending on a voltage applied to a control terminal thereof. Referring to FIG. 1 as an example, the first switch Q1 may be a P-channel field effect transistor. In this case, the first terminal, the second terminal, and the control terminal of the first terminal Q1 may be a source terminal, a drain terminal, and a gate terminal, respectively.

A diode D1 may be connected between the first terminal of the first switch Q1 and the negative pack terminal P−. In the diode D1, anode and cathode terminals may be electrically connected to the negative terminal P− and the first terminal of the first switch Q1, and a voltage of the negative pack terminal P− may be transferred to the first terminal of the first switch Q1.

Resistance circuits R11 and R21 for generating a voltage (short detection voltage (SD)) outputted to the controller 220 may be connected through the output node n1 between the first switch Q1 and the ground. Opposite ends of a first resistor R11 may be connected to the output node n1 and the ground, respectively, and opposite ends of a second resistor R12 may be respectively connected to the second terminal of the first switch Q1 and the output node n1. Accordingly, when the first switch Q1 is turned off, the voltage of the output node n1 is pulled down to the ground voltage by the first resistor R11, and when the first switch Q1 is turned on (conducted), a voltage applied to the second terminal of the first switch Q may be divided by the first and second resistors R11 and R12 to be transferred to the output node n1.

A second switch Q2 for controlling an on or off state of the first switch Q1 may be connected between the control terminal of the first switch Q1 and the ground.

The first terminal and the second terminal of the second switch Q2 may be electrically connected to the ground and the control terminal of the first switch Q1, respectively, and the control terminal of the second switch Q2 may be connected to the controller 220. Accordingly, the first and second terminals of the second switch Q2 are switched depending on a control signal CS applied from the controller 220 to the control terminal of the second switch Q2. Referring to FIG. 1 as an example, the second switch Q2 may be an N-channel field effect transistor. In this case, the first terminal, the second terminal, and the control terminal of the second terminal Q2 may be a source terminal, a drain terminal, and a gate terminal, respectively.

Resistance circuits R21 and R22 for generating a control voltage applied from the voltage of the negative pack terminal P− to the control terminal of the first switch Q1 may be connected to the second terminal of the second switch Q2. A third resistor R21 may be connected between the second terminal of the second switch Q2 and the control terminal of the first switch Q1. In addition, a fourth resistor R22 may have a first end that is electrically connected to the negative electrode pack terminal P− through the diode D1 and a second end that is electrically connected to the control terminal of the first switch Q1. Accordingly, the voltage of the negative pack terminal P− is transferred to the control terminal of the first switch Q1 through the diode D1 and the fourth resistor R22 when the second switch Q2 is turned off, and a voltage between the negative pack terminal P− and the ground may be transferred to the control terminal of the first switch Q1 by the first and second resistors R11 and R12 when the second switch Q2 is turned on (conducted). Accordingly, when the second switch Q2 is turned on by the control signal CS, the first switch Q1 may also be switched to the on state.

When a short circuit between the pack terminals P+ and P− is detected by using the short circuit detection circuit 300, the controller 220 may activate the short circuit detection circuit 300 by controlling the control signal CS applied to the second switch Q2 to turn on the first switch Q1 and the second switch Q2. According to an exemplary embodiment, the controller 220 may perform short circuit detection by activating the short circuit detection circuit 300 only when the discharge control switch 230 is turned off.

When the short circuit detection circuit 300 is activated by the controller 220 under a normal load state (a state in which no short circuit occurs between the pack terminals P+ and P−), the negative pack terminal P− is pulled down to a ground voltage by the first switch Q1 of the short circuit detection circuit 300 as illustrated in FIG. 2. Accordingly, a voltage SD outputted to the output node n1 of the short circuit detection circuit 300 becomes a ground voltage. On the other hand, when the short circuit detection circuit 300 is activated by the controller 220 in a state where a short circuit occurs between the pack terminals P+ and P− due to a short circuit inside the load 20, a current Ishort flows to the short circuit detection circuit 300 so that the voltage of the electrode pack terminal P− rises to the voltage of the positive electrode pack terminal P+ as illustrated in FIG. 3. Accordingly, a voltage that is higher than the ground voltage is outputted to the output node n1 of the short circuit detection circuit 300, and the controller 220 detects it to determine a short circuit state.

When the battery pack 10 and a set are connected to each other, the controller 220 may activate the short circuit detection circuit 300 for a predetermined time to monitor the short circuit state between the pack terminals P+ and P− before the discharge control switch 230 is switched to the on state by an operation of a load 20 in the set. The discharge control switch 230 may be set to maintain the off state as usual in order to detect a short circuit state of the load 20 by using the short circuit detection circuit 300 before discharging the power of the battery module 100 to the load 20. That is, even when the battery pack 10 and the set are connected, the discharge control switch 230 may be set to maintain the off state until software of the set instructs an operation of the load 20 so that the battery module 100 needs to be discharged.

When the short circuit state is detected through the short circuit detection circuit 300 before the load 20 starts its operation, the controller 220 may maintain the discharge control switch 230 to be in the off state, may transmit warning information to the set, or may output a warning output through an output device (e.g. an LED). Accordingly, the discharge control switch 230 does not need to suffer stress caused by a short circuit as the battery pack 10 checks a short circuit condition in advance before starting discharge, and thus it is unnecessary to use a high performance discharge control switch.

When the discharge control switch 230 is turned off during the operation of the load 20, i.e., due to a short circuit between the pack terminals P+ and P− after the discharge is started, the controller 220 may periodically activate the short circuit detection circuit 300 to monitor the short circuit state between the pack terminals P+ and P− until the short circuit between the pack terminals P+ and P− is released. In this case, the controller 220 maintains the discharge control switch 230 to be in the off state until it is determined that the short circuit between the pack terminals P+ and P− is released through the short circuit detection circuit 300. Accordingly, a possibility of a fuse opening due to frequent short circuits is reduced, and there is no need to use an expensive battery IC equipped with a load short circuit detection function, and thus there is an effect of lowering a unit cost of the battery pack 10.

While exemplary embodiments of the present invention have been particularly shown and described with reference to the accompanying drawings, the specific terms used herein are only for the purpose of describing the invention and are not intended to define the meanings thereof or be limiting of the scope of the invention set forth in the claims. Therefore, those skilled in the art will understand that various modifications and other equivalent embodiments of the present invention are possible. Consequently, the true technical protective scope of the present invention must be determined based on the technical spirit of the appended claims.

DESCRIPTION OF SYMBOLS

10: battery pack
100: battery module
210: battery IC
220: controller
230: discharge control switch
240: charging control switch
300: short circuit detection circuit
Q1, Q2: switch
R11, R12, R21, R22: resistor
D1: diode
SR: shunt resistor

The invention claimed is:

1. A battery protective circuit comprising:
a first switch connected between a negative pack terminal of a battery pack and an output node to control an electrical connection between the negative pack terminal and the output node;
a second switch connected between a control terminal of the first switch and a ground;
a first resistor connected between the output node and the ground;
a second resistor connected between the first switch and the output node, the second resistor being in a current path of the first switch and configured to conduct a same current as that passing through the first switch, each of the first resistor and the second resistor being directly connected to the output node, the first resistor being directly connected to the ground;
a diode having a first terminal directly connected to the negative pack terminal and having a second terminal directly connected to a first terminal of the first switch;
a third resistor directly connected between the control terminal of the first switch and a terminal of the second switch;

a fourth resistor directly connected between the second terminal of the diode and the control terminal of the first switch; and
a controller configured to detect an output voltage of the output node, to control an on state or an off state of the first switch, and to determine a short circuit state between pack terminals of the battery pack based on the output voltage of the output node.

2. The battery protective circuit of claim 1, wherein the second switch is configured to control a voltage applied to the control terminal of the first switch depending on a control signal applied from the controller.

3. The battery protective circuit of claim 2, wherein the first switch and the second switch are a P-channel transistor and an N-channel transistor, respectively, and on or off of the P-channel transistor is controlled depending on a voltage applied to the control terminal of the P-channel transistor through the N-channel transistor.

4. The battery protective circuit of claim 1, wherein the controller turns on the first switch in a state where a discharge control switch of the battery pack is turned off.

5. A battery pack comprising:
a plurality of pack terminals;
a battery module configured to include one or more cells;
a discharge control switch connected between one of the pack terminals and the battery module to connect or cut off a discharge path of the battery module;
a first switch connected between an output node and a negative pack terminal among the pack terminals to control electrical connection between the negative pack terminal and the output node;
a second switch connected between a control terminal of the first switch and a ground;
a first resistor connected between the output node and the ground;
a second resistor connected between the first switch and the output node, the second resistor being in a current path of the first switch and configured to conduct a same current as that passing through the first switch, each of the first resistor and the second resistor being directly connected to the output node, the first resistor being directly connected to the ground;
a diode having a first terminal directly connected to the negative pack terminal and having a second terminal directly connected to a first terminal of the first switch;
a third resistor directly connected between the control terminal of the first switch and a terminal of the second switch;
a fourth resistor directly connected between the second terminal of the diode and the control terminal of the first switch; and
a controller configured to detect an output voltage of the output node, to control an on state or an off state of the first switch and to determine a short circuit state between the pack terminals based on the output voltage of the output node.

6. The battery pack of claim 5, wherein the second switch is configured to control a voltage applied to the control terminal of the first switch depending on a control signal applied from the controller.

7. The battery pack of claim 6, wherein the first switch and the second switch are a P-channel transistor and an N-channel transistor, respectively, and on or off of the P-channel transistor is controlled depending on a voltage applied to the control terminal of the P-channel transistor through the N-channel transistor.

8. The battery pack of claim 7, wherein the controller turns on the second switch in a state where the discharge control switch is turned off to monitor a short circuit between the pack terminals.

9. The battery pack of claim 8, wherein the controller monitors a short circuit between the pack terminals by turning on the second switch for a predetermined time before the discharge control switch is switched to an on state by starting an operation of a load connected through the pack terminals.

10. The battery pack of claim 8, wherein when the discharge control switch is turned off due to a short circuit during operation of a load connected through the pack terminals, the controller periodically monitors the short circuit between the pack terminals by periodically turning on the second switch until the short circuit is released.

\* \* \* \* \*